(12) United States Patent
Kimura et al.

(10) Patent No.: US 7,880,299 B2
(45) Date of Patent: Feb. 1, 2011

(54) SEMICONDUCTOR DEVICE

(75) Inventors: Toru Kimura, Tokyo (JP); Yuji Shirakata, Tokyo (JP)

(73) Assignee: Mitsubishi Electric Corporation, Chiyoda-Ku, Tokyo (JP)

( * ) Notice: Subject to any disclaimer, the term of this patent is extended or adjusted under 35 U.S.C. 154(b) by 279 days.

(21) Appl. No.: 12/173,495

(22) Filed: Jul. 15, 2008

(65) Prior Publication Data

US 2009/0039504 A1 Feb. 12, 2009

(30) Foreign Application Priority Data

Aug. 8, 2007 (JP) ............................. 2007-206163

(51) Int. Cl.
*H01L 23/34* (2006.01)
(52) U.S. Cl. ............... 257/718; 257/719; 257/E23.101; 257/E23.104; 361/711; 361/730; 361/807; 361/810
(58) Field of Classification Search ............ 257/718, 257/E23.101, E23.104; 361/711, 730, 807, 361/810
See application file for complete search history.

(56) References Cited

U.S. PATENT DOCUMENTS

| 4,500,941 | A | * | 2/1985 | Izumi ........................... 361/293 |
| 5,977,640 | A | * | 11/1999 | Bertin et al. ................ 257/777 |
| 6,043,981 | A | * | 3/2000 | Markow et al. ............. 361/704 |
| 2001/0004313 | A1 | * | 6/2001 | Yamaoka ..................... 361/704 |

FOREIGN PATENT DOCUMENTS

JP 2005-235992 A 9/2005

* cited by examiner

*Primary Examiner*—Tu-Tu V Ho
(74) *Attorney, Agent, or Firm*—Buchanan Ingersoll & Rooney PC

(57) ABSTRACT

The present invention is intended to obtain a semiconductor device that is reduced in size, weight, and cost and improved in performance stability and productivity.

The semiconductor device includes a semiconductor module in which a semiconductor element is sealed with a resin, a reinforcing beam fixed to an upper surface of the semiconductor module via a plate-like spring, and a frame part to which both ends of the reinforcing beam are fixed, the frame part being disposed in such a fashion as to enclose from four directions an outer periphery of the semiconductor module, plate-like spring, and the reinforcing beam.

12 Claims, 7 Drawing Sheets

[FIG. 1]
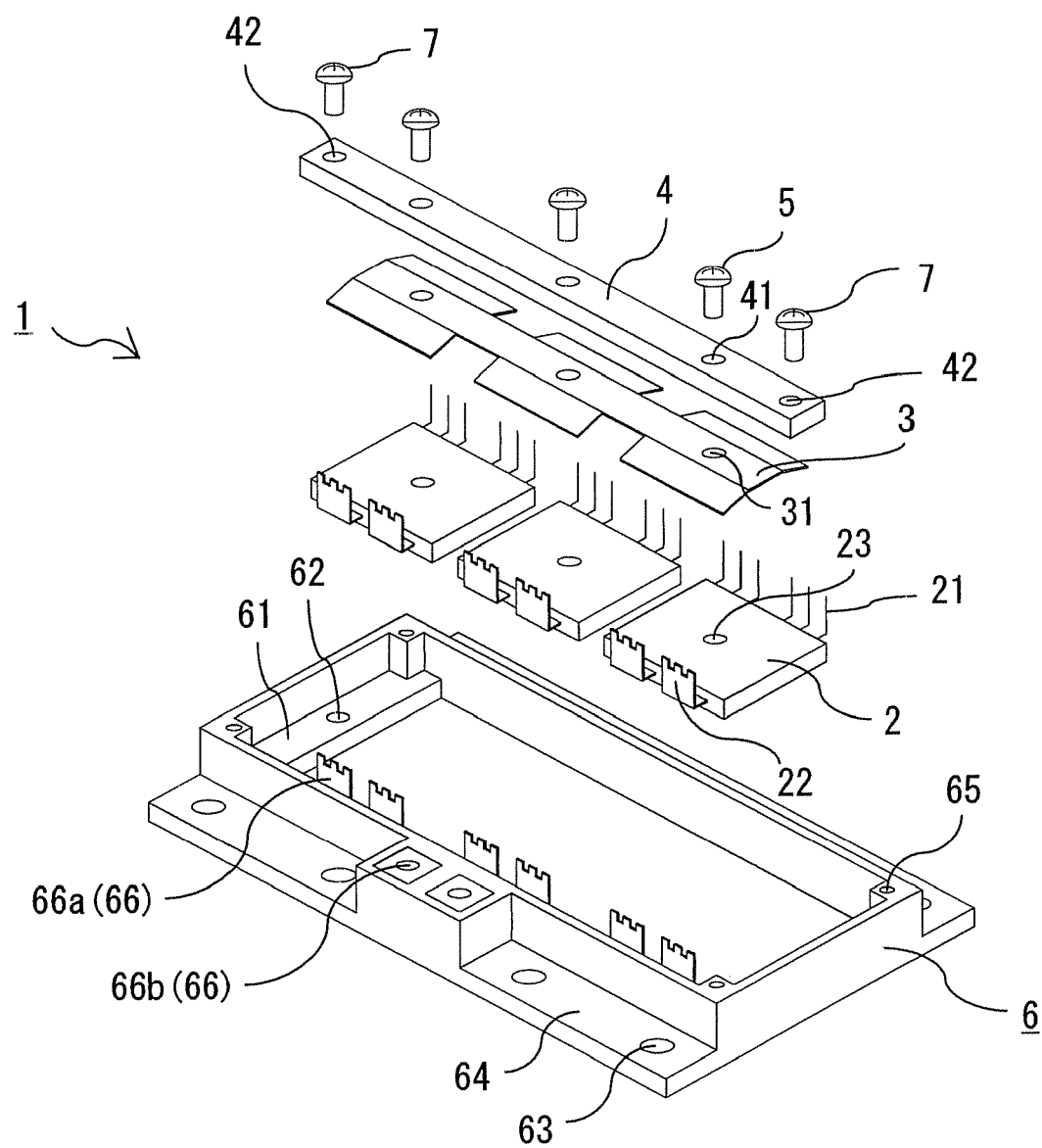

[FIG. 2]
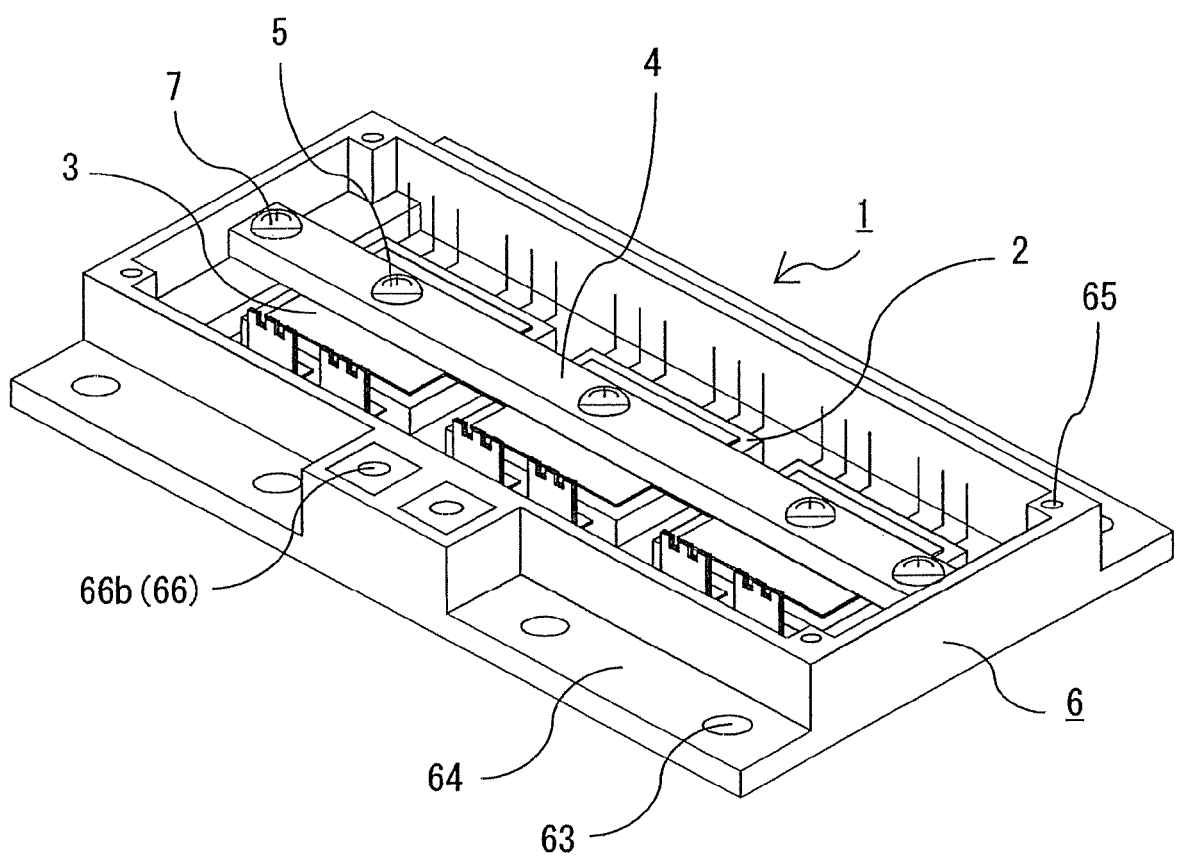

[FIG. 3]
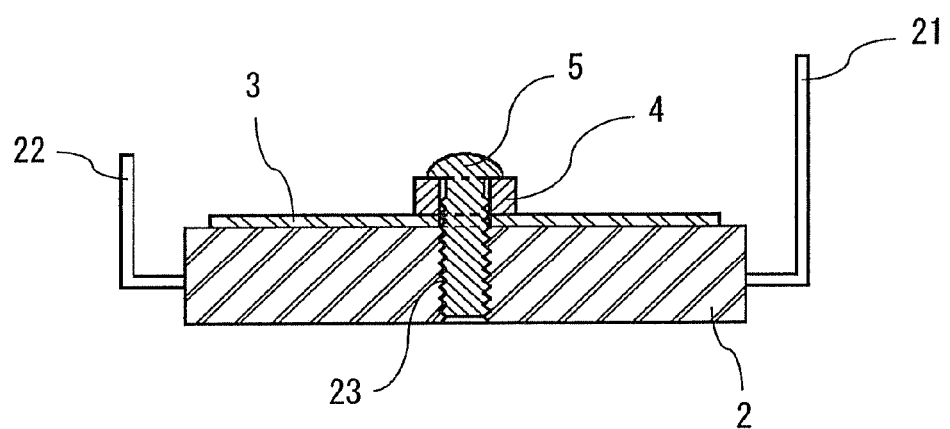
[FIG. 4]
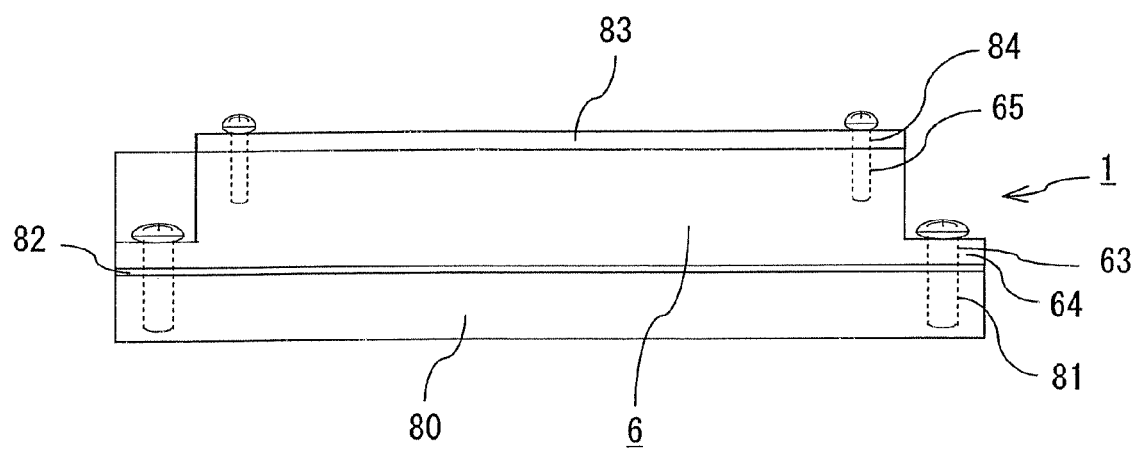

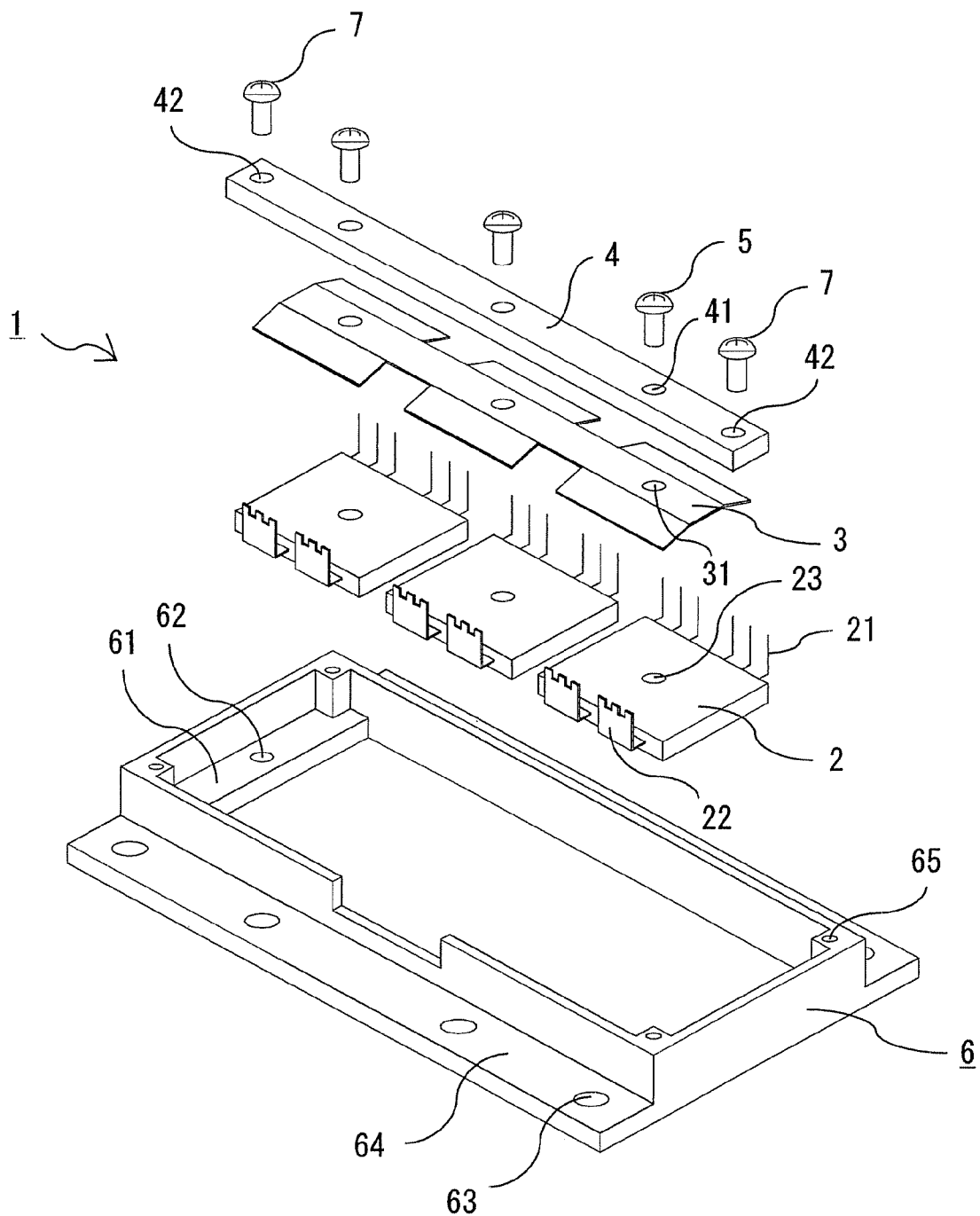
[FIG. 5]

[FIG. 6]
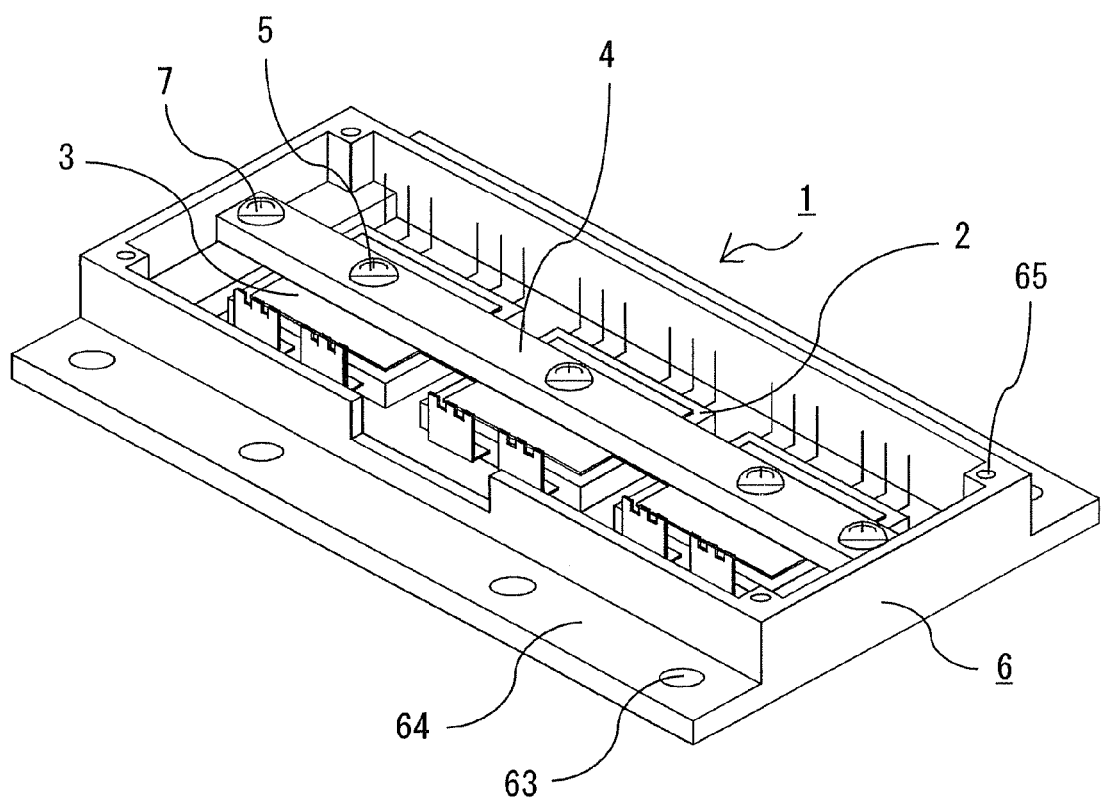

[FIG. 7]
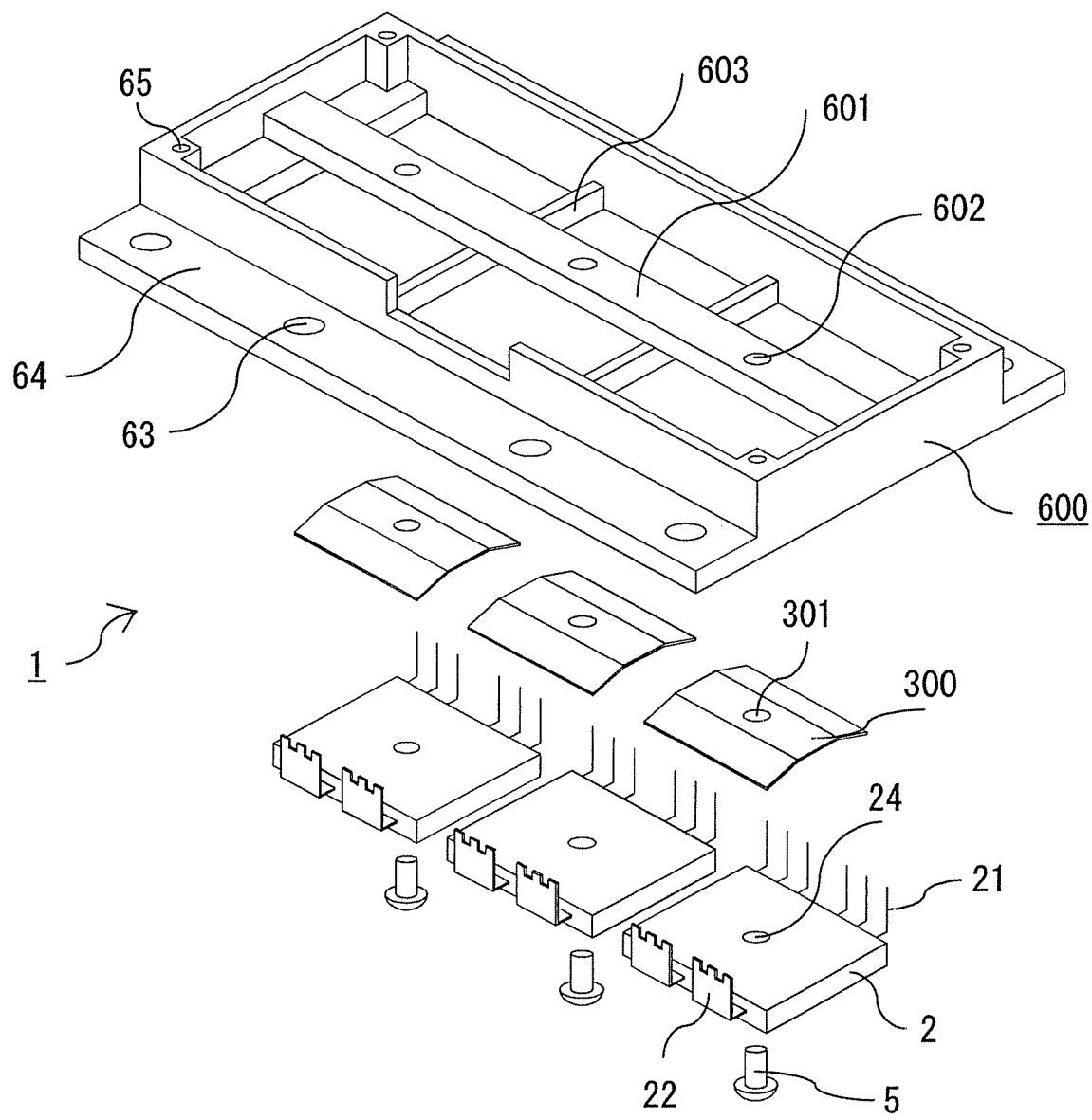

[FIG. 8]
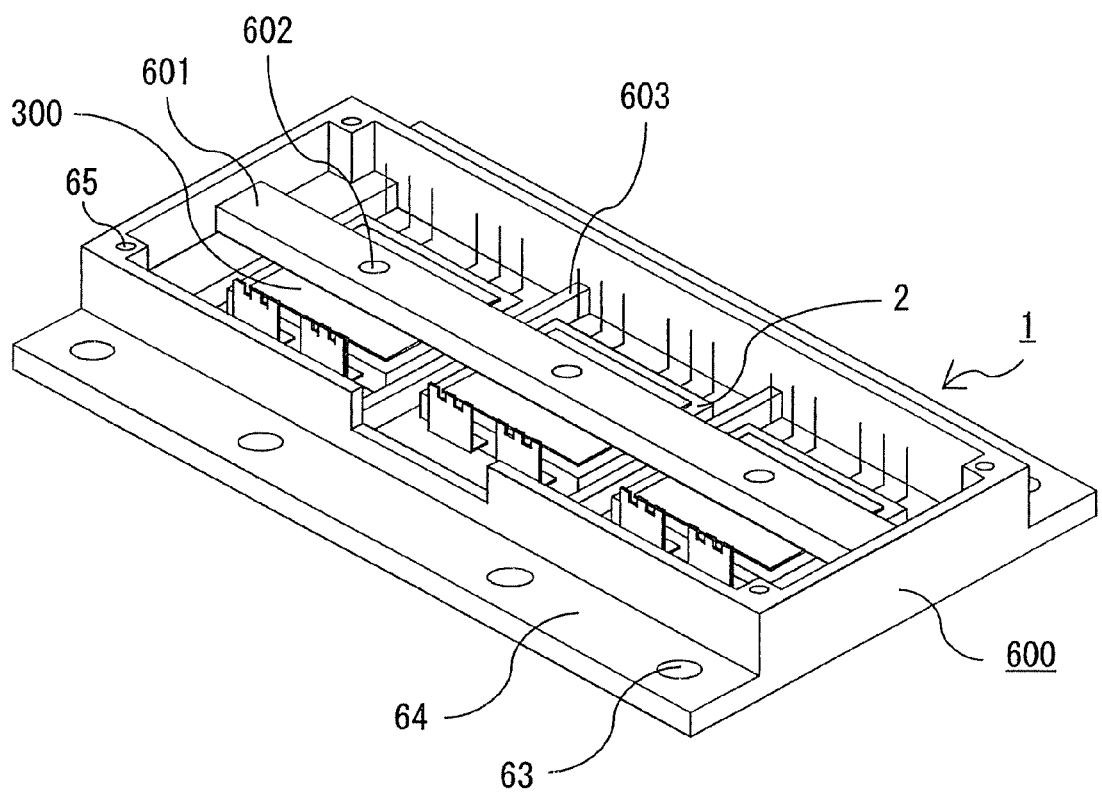
[FIG. 9]
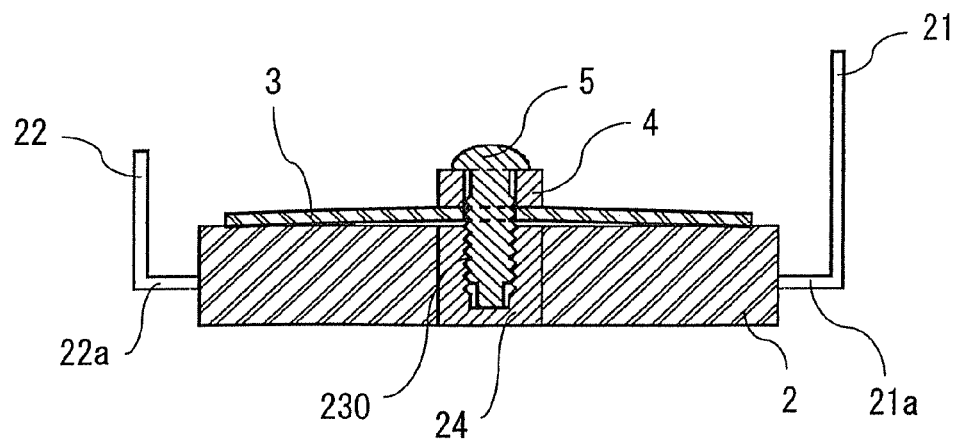

SEMICONDUCTOR DEVICE

BACKGROUND OF THE INVENTION

1. Field of the Invention

This invention relates to a semiconductor device provided with a semiconductor module that is mounted on a mobile object such as a vehicle, the invention contributing particularly to a reduction in influence of a thermal stress due to heating.

2. Description of the Background Art

Conventional semiconductor device is generally provided with a semiconductor module having a semiconductor element sealed with a resin and a screw through-hole provided at a central part thereof, a plate-like presser spring disposed at one side of the semiconductor module, a reinforcing beam for reinforcing the presser plate-like spring, and a heatsink disposed at the other side of the semiconductor module, wherein the semiconductor module is fixed to the heatsink by a screw inserted from the reinforcing beam side into the screw through-hole of the semiconductor module via the reinforcing beam and the presser plate-like spring, and the presser plate-like spring has a slit formed for dividing a peripheral part thereof (see Patent Publication 1, for example). Patent Publication 1: JP-A—2005-235992 (paragraph [0005], FIG. 1, etc.)

The conventional semiconductor device is formed by fixing the members such as the semiconductor module, the plate-like spring, and the reinforcing beam to the heatsink. The heat generated in the semiconductor module is discharged to the heatsink, and the heat transferred to the heatsink is discharged to the outside via a cooling member attached to a reverse surface (a surface reverse to a surface on which the semiconductor module is attached).

With such structure, a thermally conductive member in the form of a paste or a flexible sheet is generally provided between the semiconductor module and the heatsink and between the heatsink and the cooling member for suppressing heat resistance. In order to realize effective thermal conduction by the thermally conductive member, it is necessary to reduce a thickness of the thermally conductive member disposed between the heatsink and the semiconductor module and between the heatsink and the cooling member by increasing a pressure contact force between the members as well as to increase flatness of the heatsink for maintaining uniformity of the thickness. Therefore, a member for forming the heatsink is required to have high rigidity capable of enduring the pressure and ensuring the flatness.

However, since a copper that is generally used as a material satisfying the conditions has a high specific gravity and is expensive, there has been a problem of difficulty in achieving downsizing, light weight, and low cost of the semiconductor device when the copper is used as the member for the heatsink or the rigidity is increased by increasing the thickness of the member. Also, since a plate material that is easily available is generally used in the case of using the copper, there has been a problem of difficulty in shaping from the reasons such as cost suppression in mechanical processing and the like.

Further, there has been a problem that it is difficult to achieve a reduced and uniform thickness of the thermally conductive member due to reduction of rigidity of the heatsink and deformation of the heatsink that is caused when the heatsink is reduced in thickness, weight, and so forth in order to achieve downsizing, light weight, and reduced cost of the semiconductor device. Also, there has been a problem that the semiconductor device has difficulty in stably exhibiting the original performance since the deformation of the heatsink is subject to various factors such as influences of the pressing force by the reinforcing beam and the plate-like spring, influence of the pressure contact force for keeping the thermally conductive member thin and uniform, and influence of the thermal stress caused by a use environment temperature of the semiconductor device and the heat generation in the semiconductor module.

SUMMARY OF THE INVENTION

The present invention has been made to solve the above-described problems, and an object thereof is to obtain a semiconductor device that is reduced in size, weight, and cost and improved in performance stability and productivity.

The semiconductor device of this invention comprises a semiconductor module in which a semiconductor element is sealed with a resin, a reinforcing beam fixed to an upper surface of the semiconductor module, and a frame part to which the reinforcing beam is fixed, the frame part being disposed in such a fashion as to enclose an outer periphery of the semiconductor module and the reinforcing beam fixed to the semiconductor module.

According to the semiconductor device of this invention, since the semiconductor module is fixed at the frame part by the reinforcing beam, any heatsink is unnecessary, thereby achieving the reductions in size, weight, and cost of the semiconductor device. Also, since the heatsink is unnecessary, it is possible to discharge heat generated in the semiconductor module directly to a cooling member as well as to suppress thermal resistance, thereby enabling the semiconductor to stably exhibit its performance.

The foregoing and other objects, features, aspects, and advantages of the present invention will become more apparent from the following detailed description when read in conjunction with the accompanying drawings.

BRIEF DESCRIPTION OF THE DRAWINGS

FIG. 1 is a broken perspective view showing a structure of a semiconductor device according to Embodiment 1 of this invention;

FIG. 2 is a perspective view showing a state in which the semiconductor device of FIG. 1 is assembled;

FIG. 3 is a sectional view showing a part of the semiconductor device of FIG. 2, wherein a frame part is omitted;

FIG. 4 is a schematic diagram showing one example of fixing a cooling member and a control unit to the semiconductor device of FIG. 2;

FIG. 5 is a broken perspective view showing a structure of a semiconductor device according to Embodiment 2 of this invention;

FIG. 6 is a perspective view showing a state in which the semiconductor device of FIG. 5 is assembled;

FIG. 7 is a broken perspective view showing a structure of a semiconductor device according to Embodiment 3 of this invention;

FIG. 8 is a perspective view showing a state in which the semiconductor device of FIG. 7 is assembled; and FIG. 9 is a sectional view showing a part of the semiconductor device according to Embodiment 4 of this invention, wherein a frame part is omitted.

DETAILED DESCRIPTION OF THE PREFERRED EMBODIMENTS OF THE INVENTION

Embodiment 1

FIG. 1 is a broken perspective view showing a structure of a semiconductor device according to Embodiment 1 of this invention. FIG. 2 is a perspective view showing a state in which the semiconductor device of FIG. 1 is assembled. FIG. 3 is a sectional view showing a part of the semiconductor device of FIG. 2, wherein a frame part is omitted. FIG. 4 is a schematic diagram showing one example of fixing a cooling member and a control unit to the semiconductor device of FIG. 2.

Referring to FIGS. 1 to 3, a semiconductor device 1 is provided with semiconductor modules 2 in which semiconductor elements are sealed with a resin, a reinforcing beam 4 fixed to an upper surface of the semiconductor module 2 via a plate-like spring 3, a frame part 6 disposed in such a fashion as to enclose the semiconductor module 2, the plate-like spring 3, and the reinforcing beam 4, the reinforcing beam 4 having its both ends fixed to the frame part 6.

The semiconductor modules 2 are provided with control terminals 21 connected to a control unit described later in this specification and terminals 22 for connection to connection terminals that are provided at the frame part and described later in this specification. At a central part of the semiconductor module 2, a screw hole 23 is provided for fixing the plate-like spring 3 and the reinforcing beam 4.

In Embodiment 1, three semiconductor modules 2 are disposed in line at a predetermined interval, and the plate-like spring 3 of which a part at a position corresponding to each of the semiconductor modules 2 is formed into a pentroof type sectional shape is disposed on the upper surface of each of the semiconductor modules 2. Also, a fixing hole 31 is provided at a position on the plate-like spring 3 corresponding to the screw hole 23 of the semiconductor module 2.

On an upper surface of the plate-like spring 3, the reinforcing beam 4 extending in a direction in which the semiconductor modules 2 are disposed, i.e. along a length direction of the plate-like spring 3, is disposed, and through-holes 41 are provided corresponding to the interval at which the three semiconductor modules 2 are disposed. A fixing hole 42 for the fixation to the frame part 6 is provided at each of the both ends of the reinforcing beam 4.

The reinforcing beam 4, the plate-like spring 3, and the semiconductor modules 2 are fixed to one another by a screw 5 inserted as a first fastening tool from above the reinforcing beam 4 into the through-hole 41, the hole 31, and the screw hole 23 in this order. For example, it is possible to directly fix the reinforcing beam 4 and the semiconductor module 2 to each other without the plate-like spring 3. However, due to the structure of fixing with the plate-like spring 3 being placed between the reinforcing beam 4 and the semiconductor module 2 as in Embodiment 1, a fastening force of the screw 5 is distributed by flexure of a part of the pentroof type sectional shape of the plate-like spring 3, so that a uniform load is applied on the semiconductor module 2 when the plate-like spring 3 is fixed as being perfectly spread.

Though the members are fixed by providing the screw hole 23 formed from a mold resin on the semiconductor module 2 and fastening the screw 5 inserted from the side of the reinforcing beam 4 to the semiconductor module 2 in Embodiment 1, a nut may be formed inside the semiconductor module 2 by insertion molding when there is a risk of cracking in the resin or when a high fastening force is required. Also, the fixing method is not limited to the above, and the members may be fixed by providing a through-hole on the semiconductor module 2 in place of the screw hole 23, disposing a nut on a lower surface of the semiconductor module 2, and fastening the screw 5 with the nut, for example. Also, the members may be fixed by providing a through-hole on the semiconductor module 2 in place of the screw hole 23, providing a screw hole on the reinforcing beam 4 in place of the through-hole 41, and inserting the screw from the lower surface of the semiconductor module 2. With such constitution, thread-cutting on the semiconductor module 2 is unnecessary, and it is possible to prevent rupture of the semiconductor module 2 otherwise caused by a crack or the like in the screw hole 23.

The frame part 6 is formed in the form of a frame in such a fashion as to enclose from four directions the reinforcing beam 4, the plate-like spring 3, and the semiconductor module 2 that are integrally fixed to one another. A step part 61 is projected from each of opposite inner walls in a width direction of the frame part 6 for fixing the reinforcing beam 4, and a screw hole 62 is provided at a central part of the step part 61. The reinforcing beam 4 is disposed in such a fashion that the fixing hole 42 of the reinforcing beam 4 overlaps with the screw hole 62, so that the reinforcing beam 4 and the frame part 6 are fixed to each other when a screw 7 serving as a second fixing tool is inserted from the side of the reinforcing beam 4 to be fastened in the screw hole 62. Thus, the semiconductor module 2, the plate-like spring 3, the reinforcing beam 4, and the frame part 6 are integrally fixed to form the semiconductor device 1. Though only the reinforcing beam 4 is fixed to the frame part 6 in Embodiment 1, this invention is not limited thereto, and the plate-like spring 3 may be fixed to the frame part 6 together with the reinforcing beam 4 by extending both ends in the length direction of the plate-like spring 3.

A jutting parts 64 on which fixing holes 63 for fixing onto the cooling member described later in this specification are disposed are formed on each of both outer wall surfaces in the length direction of the frame part 6. Support parts 65 for fixing and supporting the control unit described later in this specification are provided at each of four corners of an upper surface of a framing part of the frame part 6.

A thermoplastic synthetic resin material such as ABS, PBT, and PPS may be used as a material for the frame part 6, and the frame part 6 may be shaped by injection molding. A plurality of bus bars 66 that are made from a metal having high electroconductivity, such as copper, are formed inside the frame part 6 by insertion molding or the like to serve as conductors. One end of the bus bar 66 is exposed to an inner wall side of the frame part 6 as a connection terminal 66a to be connected to the terminal 22 of the semiconductor module 2, and the other end is exposed to an outer wall side of the frame part 6 as an external terminal 66b to be connected to an external component. The terminal 22 and the connection terminal 66a are connected by welding, for example, to form a desired electric circuit. Of course, the connection method is not limited to the welding, and the connection may be established by fastening with a screw.

In Embodiment 1, thicknesses of the semiconductor module 2, the frame part 6, the step part 61, and the like are so set that positions of the lower surface of the semiconductor module 2 and the lower surface of the frame part 6 are on an identical plane when the members (semiconductor module 2, plate-like spring 3, reinforcing beam 4, frame part 6) are integrally fixed. With such constitution, the cooling member described later in this specification and the lower surface of the semiconductor module 2 are reliably brought into contact with each other.

Hereinafter, one example of fixing the cooling member 80 and the control unit 83 to the semiconductor device 1 having the structure described above will be described with reference to FIG. 4. The schematic diagram of FIG. 4 is a diagram as viewed from a side of the semiconductor device 1 shown in FIG. 2 in the width direction.

As shown in FIG. 4, the cooling member 80 is disposed at a side of the lower surface of the semiconductor device 1 and used for discharging heat generated in the semiconductor module 2 by contacting the lower surface of the semiconductor module 2. For example, a screw hole 81 is provided on the cooling member 80 at a position corresponding to the fixing hole 63 provided on the jutting part 64 of the frame part 6. The cooling member 80 is disposed below the frame part 6 in such a fashion as to be in contact with the lower surface of the semiconductor module 2, and a screw is fastened in the screw hole 81 of the cooling member 80 via the fixing hole 63, so that the frame part 6 and the cooling member 80 are fixed to each other. The fixing method of the frame member 6 and the cooling member 80 is not limited to the above, and the frame member 6 and the cooling member 80 are fixed in accordance with use conditions and the like of the semiconductor device 1.

A thermally conductive member 82 (see FIG. 4) having a thermal conductivity ratio of about 1 to a several W/mK and in the form of a paste or a flexible sheet is provided between the semiconductor module 2 and the cooling member 80 by coating, sandwiching, or the like. The thermally conductive member 82 allows smooth thermal conduction by closely contacting a contact surface between the semiconductor module 2 and the cooling member 80. A heat discharge effect of the thermally conductive member 82 is increased as a thickness thereof is reduced, but heat resistance of apart having a relatively large thickness is increased when the thickness is increased and non-uniform. Since performance of the thermally conducive member 82 is limited to the part having the larger heat resistance, the thermally conductive member 82 can be the major factor of deterioration of heat resistance when the thermally conductive member 82 is not used appropriately. Therefore, it is desirable to keep the thickness of the thermally conductive member 82 small and uniform by increasing a pressure contact force between the semiconductor module 2 and the cooling member 80.

Since the semiconductor module 2 is fixed to the frame part 6 by the reinforcing beam 4 in Embodiment 1, the pressure contact force depends on rigidity of the reinforcing beam 4. Therefore, by using an iron-based material having a high Young's modulus as a material for the reinforcing beam 4, it is possible to more reliably prevent the reinforcing beam 4 from being deformed and the like when the pressure contact force is increased.

Though only the both ends of the reinforcing beam 4 are fixed to the frame part 6 in Embodiment 1, a rib, for example, passing between the semiconductor modules 2 may be provided in the length direction of the frame part 6 for further suppressing the reinforcing beam 4 from being deformed. By fixing the both ends of the reinforcing beam 4 not only to the frame part 6 but also to the rib, it is possible to further suppress the reinforcing beam 4 from being deformed.

Also, a force of pressing the central semiconductor module 2 among the three semiconductor modules 2 can be weakened as compared to those of the semiconductor modules 2 on both ends when the reinforcing beam 4 is slightly deformed depending on the rigidity of the reinforcing beam 4. In such case, it is possible to reinforce the pressing force for the central semiconductor module 2 by changing a deformation amount of the central spring at a part of the pentroof type sectional shape among the plate-like springs 3. Specifically, the deformation amount of the spring is increased by increasing an angle of an inclined part of the pentroof type section, thereby increasing the pressing force for the semiconductor module 2. Also, the deformation amount of the spring may be changed by changing a spring constant of the plate-like spring 3.

In the case of fixing the reinforcing beam 4, the plate-like spring 3, and the semiconductor module 2 by providing the through-hole on the semiconductor module 2 and disposing the nut on the lower surface side of the semiconductor module 2 or by providing the through-hole on the semiconductor module 2, providing the screw hole on the reinforcing beam 4, and inserting the screw from the lower surface side of the semiconductor module 2, head portions of the nut and the screw are projected on the lower surface of the semiconductor module 2. Therefore, in order to achieve the close contact between the cooling member 80 and the semiconductor module 2, a recessed part is provided on the cooling member 80 at a part corresponding to the jutting part of the nut.

The control unit 83 (see FIG. 4) is disposed above the frame part 6, for example, for driving and controlling the semiconductor module 2. In Embodiment 1, through-holes 84 are provided on the control unit 83 at each of positions corresponding to the support members 65 provided at the four corners of the framing part of the frame part 6, and the control unit 83 is fastened with a screw as being disposed in such a fashion as to cover the upper side of the frame part 6, thereby fixing the control unit 83 and the frame part 6 to each other. By connecting the control terminal 21 of the semiconductor module 2 to the control unit 83, the control unit 83 performs the control on the semiconductor module 2. Of course, the connection method for the frame part 6 and the control unit 83 is not limited to the above, and the fixing method may be selected in accordance with use conditions and the like of the semiconductor device 1.

As described in the foregoing, since the semiconductor device 1 of Embodiment 1 does not require the heatsink since the semiconductor module 2 is fixed to the frame part 6 via the reinforcing beam 4, reductions in size, weight, and cost of the semiconductor device 1 are achieved.

Also, since the heatsink is not provided, it is possible to discharge the heat of the semiconductor module 2 by bringing the semiconductor module 2 and the cooling member 80 into direct contact with each other as well as to reduce the number of the thermally conductive member 82 worsening the heat resistance provided between the semiconductor module 2 and the cooling member 80 to only one. Accordingly, since the heat resistance is suppressed and the heat generated in the semiconductor module 2 is effectively discharged, performance of the semiconductor device 1 is stably exhibited. Also, due to the reduction in number of components, it is possible to achieve a reduced cost, a reduction in assembly process steps, and improvement in productivity.

Also, by forming the reinforcing beam 4 from the material having the high rigidity, it is possible to prevent the reinforcing beam 4 from being deformed when the pressure contact force between the semiconductor module 2 and the cooling member 80 is increased. Accordingly, it is possible to reliably establish the pressure contact between the upper surface of the cooling member 80 disposed at the lower surface side of the frame 6 and the lower surface of the semiconductor module 2 as well as to keep the thickness of the thermally conductive member 82 disposed between the members to be small and uniform. Therefore, the heat resistance is suppressed, thereby stabilizing the performance of the semiconductor device 1.

Since the fastening force of the screw 5 is distributed when the part of the pentroof type sectional shape of the plate-like spring 3 is deflected by fixing the semiconductor module 2 and the reinforcing beam 4 to each other via the plate-like spring 3, it is possible to uniformly apply a load on the whole semiconductor modules 2.

It is possible to adjust the pressing force for the semiconductor module 2 by partially changing the spring deformation amount of the plate-like spring 3. For example, by increasing the spring deformation amount of the part of the pentroof type sectional shape positioned at the central part of the plate-like spring 3 where the reinforcing beam 4 is subject to deformation, it is possible to reinforce the pressing force for the central semiconductor module 2, thereby keeping the uniform pressure contact force between the semiconductor module 2 and the cooling member 80.

Since the synthetic resin is used as the material for the frame part 6, and since the plurality of bus bars 66 are formed inside the frame part 6 by insertion molding, wiring work and connection work inside the semiconductor device 1 are facilitated, and it is possible to realize a preferable shape of the semiconductor device 1 easily and at a low cost.

Since the support part 65 for supporting the control unit 83 that controls the semiconductor module 2 is provided on the frame part 6, it is possible to support the control unit 83 by the simple structure, thereby enabling a reduction in number of components, suppression of assembly cost, simplification of assembly process, and improvement in productivity.

Embodiment 2

While the frame part 6 is made from the synthetic resin material in Embodiment 1, the frame part is made from a metal having high rigidity in Embodiment 2. FIG. 5 is a broken perspective view showing a structure of a semiconductor device according to Embodiment 2 of this invention. FIG. 6 is a perspective view showing a state in which the semiconductor device of FIG. 5 is assembled. Components same as those of Embodiment 1 are denoted by the same reference numerals, and descriptions thereof are omitted.

Referring to FIGS. 5 and 6, a frame part 6 is made from a metal material having high rigidity, such as iron, aluminum, and magnesium, and produced by molding, die casting, or the like. Since the frame part 6 itself is formed from the electroconductive material, it is difficult to adapt the structure of Embodiment 1 wherein the bus bars serving as electroconductive parts are formed by insertion molding, and the connection terminal and the external terminal are exposed. Accordingly, a terminal board (not shown) for forming internal wiring and external terminal is separately provided.

As described above, since the frame part 6 is a molded article, die cast article, or the like made from the metal material having a greater freedom degree for shaping in the semiconductor device 1 of Embodiment 2, it is possible to enable improvement in rigidity in the frame part, easy shaping, and low production cost in addition to the effects of Embodiment 1.

Since the support member 65 supporting the control unit 83 is also made from the metal material, the rigidity in increased, and it is possible to prevent a loss at the support part 65 otherwise caused by vibration of the semiconductor device 1, thereby improving vibration resistance of the semiconductor device 1.

Also, when the rib (not shown) passing between the semiconductor modules 2 and made from the metal material is provided on the frame part 6, it is possible to further suppress the reinforcing beam 4 from being deformed as compared to Embodiment 1 as well as to reliably achieve reductions in thickness and heat resistance of the thermally conductive member 82.

Embodiment 3

While the frame part and the reinforcing beam are formed as separate components and fixed by the screw and the like in Embodiments 1 and 2, the frame part is integrally formed with the reinforcing beam in Embodiment 3. A material for the frame part may be the synthetic resin as in Embodiment 1 or the metal material as in Embodiment 2 depending on the object, and the case of using the metal material will be described in Embodiment 3.

FIG. 7 is a broken perspective view showing a structure of a semiconductor device according to Embodiment 3 of this invention. FIG. 8 is a perspective view showing a state in which the semiconductor device of FIG. 7 is assembled. Components same as those of Embodiment 1 are denoted by the same reference numerals, and descriptions thereof are omitted.

As shown in FIGS. 7 and 8, the semiconductor module 2 and a plate-like spring 300 fixed to the upper surface of the semiconductor module 2 are disposed below a beam part 601 formed integrally with a frame part 600 and serving as the reinforcing beam. The screw 5 serving as the first fixing tool is fastened as being inserted from below the semiconductor module 2 into the through-hole 24 provided at the central part of the semiconductor module 2, a hole 301 provided on the plate-like spring 300, and a screw hole 602 provided on the beam part 601 in this order, so that the semiconductor module 2 and the plate-like spring 300 are fixed to the beam part 601 of the frame part 600.

A rib 603 passing between the semiconductor modules 2 fixed to the beam part 601 is formed on the frame part 600 to support the beam part 601. The plate-like spring 300 is divided into three components corresponding to the semiconductor modules 2, so that the plate-like spring 300 is fixed to the beam part 601 while avoiding the rib 603.

Since the frame part 600 is integrally formed with the beam part 601 serving as the reinforcing beam in the semiconductor device 1 of Embodiment 3, it is possible to achieve a reduction in number of components and simplification of assembly process in addition to the effects same as those of the above-described Embodiments. Also, the integrally formed component contributes to realization of higher rigidity.

Since the screw 5 serving as the first fixing tool is inserted from below the semiconductor module 2 to be fastened in the screw hole 602 of the beam part 601, it is unnecessary to provide a screw hole and a nut by insertion molding on the semiconductor module 2. Therefore, thread-cutting on the semiconductor module 2 is unnecessary, and it is possible to prevent rupture of the semiconductor module 2 otherwise caused by a crack or the like in the screw hole. In the case where a head portion of the screw 5 is projected on the lower surface of the semiconductor module 2, a recessed part corresponding to the projected part of the screw is formed on the cooling member 80 in order to achieve close contact between the cooling member 80 and the semiconductor module 2. Also, as described in Embodiment 1, the structure of fastening from the beam part 601 serving as the reinforcing beam may be adapted.

Since the rib 603 is formed on the frame part 600, it is possible to more reliably support the beam part 601, thereby preventing the beam part 601 from being deformed. Accordingly, it is possible to reduce the thickness of the thermally conductive member 82 as well as to suppress the heat resistance, thereby stabilizing the performance of the semiconductor device 1. Note that the rib 603 is not always necessary, and, in the case where the structure wherein the rib 603 is omitted, the shape of the plate-like spring 3 of Embodiment 1 and 2 is adapted without dividing the plate-like spring 300 into three components.

Embodiment 4

While the lower surface of the semiconductor module 2 and the lower surface of the frame part 6 (frame part 600) are positioned on the identical plane in the semiconductor device 1 described in Embodiments 1 to 3, so that the cooling member 80 attached from the lower surface side of the semiconductor device 1 and the semiconductor module 2 are brought into contact without fail, and that the thermally conductive member 82 disposed between the cooling member 80 and the semiconductor module 2 is thin and uniformly pressed. As accuracy required for such design, it is necessary to keep a difference between the lower surface of the semiconductor module 2 and the lower surface of the frame part 6 to be ±50 µm or less. Therefore, it is generally considered desirable to perform molding of the semiconductor module 2, the frame part 6 (frame part 600), and the like with accuracy achieving the accuracy of ±50 µm or less.

In Embodiment 4, a structure wherein the cooling member 80 attached from the lower surface side of the semiconductor device 1 and the semiconductor module 2 are reliably brought into contact without ensuring the above-specified dimension accuracy will be described.

FIG. 9 is a sectional view showing a part of the semiconductor device according to Embodiment 4 of this invention, wherein a frame part is omitted.

Since a basic structure of Embodiment 4 is the same as that of Embodiment 1, a perspective view thereof is the same as FIG. 2. As shown in FIG. 9, the semiconductor module 2 and the reinforcing beam 4 are fixed via the plate-like spring 3 in a state where the semiconductor module 2 and the plate-like spring 3 are not in close contact with a slight gap being defined therebetween. Components same as those of Embodiment 1 are denoted by the same reference numerals, and descriptions thereof are omitted.

As shown in FIGS. 2 and 9, the semiconductor module 2 is provided with the control terminal 21 connected to the control unit 83 (see FIG. 4) and the terminal 22 for connection to the connection terminal 66a of the frame part 6, and horizontal members 21a and 22b are provided on the control terminal 21 and the terminal 22, respectively. A screw hole 230 for fixing the plate-like spring 3 and the reinforcing beam 4 is provided on the central part of the semiconductor module 2, and the screw hole 230 does not penetrate through the semiconductor module 2 to serve as a blind hole. The screw hole 230 may be formed by a mold resin, but a structure of allowing insertion molding of the nut 24 is adapted in Embodiment 4 to achieve strengthening of a part of the screw hole 230.

In the case of fixing the reinforcing beam 4, the plate-like spring 3, and the semiconductor module 2, the screw 5 inserted from above the reinforcing beam 4 is stopped at the bottom of the screw hole 230, so that the plate-like spring 3 and the semiconductor module 2 are fixed with the gap being defined therebetween.

With the structure of defining the gap as described above, when the reinforcing beam 4 is fixed to the frame part 6 to integrally fix the semiconductor module 2, the plate-like spring 3, the reinforcing beam 4, and the frame part 6, the lower surface of the semiconductor module 2 is projected from the lower surface of the frame part 6 by the gap. When the cooling member 80 is attached to the semiconductor device 1 from below (see FIG. 4), the plate-like member 3 is deformed as being pressed by the cooling member 80, and the lower surface of the semiconductor 2 is moved as being pressed upward by the cooling member 80 to reach the position at which the lower surface of the semiconductor module 2 is on the plane where the lower surface of the frame part 6 is positioned. Therefore, even when the dimension accuracy in a thickness direction of the semiconductor module 2 and the frame part 6 is not maintained as high as specified above, the semiconductor module 2 and the cooling member 80 are reliably brought into contact to each other, and it is possible to keep the small thickness of the thermally conductive member 82 disposed between the semiconductor module 2 and the cooling member 80 as well as to have the thermally conductive member 82 pressed uniformly.

When the semiconductor module 2 is moved as being pressed upward by the cooling member 80, relative positions of the semiconductor module 2 and the frame part 6 are changed to easily cause a stress on the connection part of the control unit 83 and the control terminal 21 and the connection part of the connection terminal 66a and the terminal 22. In such case, the stress caused on the connection parts is alleviated by deformation of the horizontal parts 21a and 22a provided respectively on the control terminal 21 and the terminal 22.

Since the stress applied on the connection parts is increased in the case where the semiconductor module 2 is greatly projected as compared to the frame 6, i.e. in the case where the gap between the semiconductor module 2 and the plate-like spring 3 is large, it is necessary to lengthen the horizontal parts 21a and 22a that are used for alleviating the stress. Therefore, a projection amount of the semiconductor module 2 may preferably be about 0.05 to 0.2 mm so as not to prevent downsizing of the semiconductor device 1.

Since the semiconductor module 2 and the reinforcing beam 4 are fixed in a state where the gap is defined between the semiconductor module 2 and the plate-like spring 3 in the semiconductor device 1 of Embodiment 4, it is possible to change the height of the lower surface of the semiconductor module 2 by way of the deformation of the plate-like spring 3. Accordingly, in the case of fixing the cooling member 80 to the semiconductor device 1, it is possible to align the lower surface of the semiconductor module 2 and the lower surface of the frame part 6 since the semiconductor module 2 is lifted upward as being pressed by the cooling member 80. Therefore, without ensuring the dimension accuracy in the thickness direction of the semiconductor module 2 and the frame part 6 as high as the above-specified accuracy, the semiconductor module 2 and the cooling member 80 are brought into contact with each other, and it is possible to keep the small thickness of the thermally conductive member 82 as well as to have the thermally conductive member 82 pressed uniformly.

Since the horizontal member 21a and the horizontal member 22a are provided on the control terminal 21 and the terminal 22, respectively, it is possible to alleviate the stress on the connection parts between the control unit 83 and the control terminal 21 and between the connection terminal 66a and the terminal 22 occurring by movement of the semiconductor module 2.

Though Embodiment 4 has been described based on the structure of Embodiment 1, it is of course possible to combine Embodiment 4 with the structure of Embodiment 2 or 3. For instance, it is possible to change the through-hole 24 of the semiconductor module 2 into a blind hole in Embodiment 3.

Various modifications and alterations of this invention will be apparent to those skilled in the art without departing from the scope and spirit of this invention, and it should be understood that this invention is not limited to the illustrative embodiments set forth herein.

What is claimed is:

1. A semiconductor device comprising:
    a semiconductor module in which a semiconductor element is sealed with a resin,
    a reinforcing beam fixed to an upper surface of the semiconductor module, and
    a frame part to which the reinforcing beam is fixed, the frame part being disposed in such a fashion as to enclose an outer periphery of the semiconductor module and the reinforcing beam fixed to the semiconductor module, and wherein a bottom of the frame part is open-ended.
2. The semiconductor device according to claim 1, wherein the semiconductor module and the reinforcing beam are fixed via a plate-like spring.
3. The semiconductor device according to claim 1, wherein
    the semiconductor module and the reinforcing beam are fixed via a plate-like spring,
    the semiconductor module and the reinforcing beam are fixed with a gap being defined between the semiconductor module and the plate-like spring, and
    the semiconductor module is movable in a vertical direction with respect to the frame part by way of deformation of the plate-like spring.
4. The semiconductor device according to claim 1, wherein
    the semiconductor module and the reinforcing beam are fixed via a plate-like spring,
    a deformation amount of the plate-like spring is partially changed.
5. The semiconductor device according to claim 1, wherein
    the frame part is made from a synthetic resin, and
    a conduction part electrically connected to the semiconductor module is formed inside the frame part by insertion molding.
6. The semiconductor device according to claim 1, wherein the frame part is made from a metal material.
7. The semiconductor device according to claim 1, wherein the frame part is integrally formed with the reinforcing beam.
8. The semiconductor device according to claim 1, wherein the frame part comprises a support member for supporting a control unit controlling the semiconductor module.
9. The semiconductor device according to claim 1 further comprising a cooling member mounted to the frame and extending across the open bottom thereof, wherein an upper surface of the cooling member supports the semiconductor module from below and conducts heat therefrom.
10. The semiconductor device according to claim 9, wherein a thermally conductive member is disposed on the upper surface of the cooling member.
11. The semiconductor device according to claim 9, wherein the bottom surface of the semiconductor module and the lowest surface of the frame lie on the same plane.
12. The semiconductor device according to claim 8 further including a control unit mounted atop the frame.

* * * * *